United States Patent
Jaffari

(10) Patent No.: US 9,906,195 B2
(45) Date of Patent: Feb. 27, 2018

(54) HIGH BANDWIDTH AMPLIFIER

(71) Applicant: SAMSUNG DISPLAY CO., LTD., Yongin-si, Gyeonggi-Do (KR)

(72) Inventor: Nasrin Jaffari, San Jose, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 103 days.

(21) Appl. No.: 14/946,704

(22) Filed: Nov. 19, 2015

(65) Prior Publication Data

US 2016/0164475 A1    Jun. 9, 2016

Related U.S. Application Data

(60) Provisional application No. 62/087,776, filed on Dec. 4, 2014.

(51) Int. Cl.
*H03F 1/42* (2006.01)
*G09G 3/20* (2006.01)
*H03F 3/193* (2006.01)

(52) U.S. Cl.
CPC ............ *H03F 1/42* (2013.01); *G09G 3/2085* (2013.01); *H03F 3/193* (2013.01); *G09G 2300/0833* (2013.01); *G09G 2310/0291* (2013.01); *H03F 2200/174* (2013.01)

(58) Field of Classification Search
CPC combination set(s) only.
See application file for complete search history.

(56) References Cited

U.S. PATENT DOCUMENTS

| | | |
|---|---|---|
| 5,155,449 A | 10/1992 | Ito |
| 7,109,799 B2 | 9/2006 | Yin et al. |
| 7,193,468 B2 | 3/2007 | Kwon et al. |
| 7,602,246 B2 | 10/2009 | Zhang et al. |
| 7,639,079 B2 | 12/2009 | Chang et al. |
| 7,676,239 B1 | 3/2010 | Doyle et al. |
| 7,893,766 B1 | 2/2011 | Cranford, Jr. et al. |
| 7,982,542 B1 | 7/2011 | Sicard |

FOREIGN PATENT DOCUMENTS

KR    10-2014-0101088    8/2014

OTHER PUBLICATIONS

KR 10-1449690, Published Oct. 13, 2014 Corresponds to KR 10-2014-0101088, filed Aug. 19, 2014 as set forth above.
Machine Translation of KR 10-2014-0101088.

*Primary Examiner* — Van Chow
(74) *Attorney, Agent, or Firm* — Lewis Roca Rothgerber Christie LLP

(57) ABSTRACT

An amplifier including: an input terminal coupled to a first node; an output terminal coupled to a second node; and a transistor coupled between a first power source and a second power source, the transistor including: a gate electrode coupled to the first node; a drain electrode coupled to the second node; a source electrode coupled to a third node; and a bulk electrode coupled to a fourth node and configured to receive a bulk voltage to change a threshold voltage of the transistor.

19 Claims, 2 Drawing Sheets

HIGH BANDWIDTH AMPLIFIER

CROSS-REFERENCE TO RELATED APPLICATION(S)

This utility patent application claims priority to and the benefit of U.S. Provisional Patent Application Ser. No. 62/087,776, filed Dec. 4, 2014, entitled "HIGH BANDWIDTH AMPLIFIER" the entire content of which is incorporated by reference herein.

BACKGROUND

A single stage amplifier generally includes one transistor, a bias circuit, and other components. Single stage amplifiers may be categorized as either a common-gate amplifier, a common-drain amplifier, or a common-source amplifier, depending on which terminals of the transistor a signal enters and exits. The terminal in which the signal does not enter nor exit is referred to as the "common terminal."

In a common-gate amplifier, the source terminal serves as the input, the drain terminal serves as the output, and the gate is generally connected to ground or a common voltage. In a common-drain amplifier, the gate terminal serves as the input, the source terminal serves as the output, and the drain terminal is common. In a common-source amplifier, the gate terminal serves as the input, the drain terminal serves as the output, and the source terminal is common.

An ideal amplifier has high gain (e.g., DC gain) and high bandwidth (also known as 3 dB loss frequency). In some amplifiers, the 3 dB loss frequency may be increased by providing frequency peaking. However, in these amplifiers, the DC gain is typically reduced in order to provide the frequency peaking.

The above information disclosed in this Background section is only for enhancement of understanding of the background of the invention, and therefore, it may contain information that does not constitute prior art.

SUMMARY

One or more aspects of example embodiments of the present invention relate to a common-source amplifier. One or more aspects of example embodiments of the present invention relate to a common-source amplifier having higher bandwidth than that of other common-source amplifiers, but with negligible or no loss in DC gain.

According to an embodiment of the present invention an electronic device includes: a display device including a plurality of pixels coupled to a plurality of gate lines and a plurality of data lines; and an amplifier including: an input terminal coupled to a first node; an output terminal coupled to a second node; and a transistor coupled between a first power source and a second power source, the transistor including: a gate electrode coupled to the first node; a drain electrode coupled to the second node; a source electrode coupled to a third node; and a bulk electrode coupled to a fourth node and configured to receive a bulk voltage to change a threshold voltage of the transistor.

The amplifier may further include: a bulk capacitor coupled between the first node and the fourth node.

The amplifier may further include: a bulk resistor coupled between the third node and the fourth node.

The transistor may include an NMOS transistor, and the third node may be coupled to the second power source.

The transistor may include a PMOS transistor, and the third node may be coupled to the first power source.

The bulk capacitor and the bulk resistor may be configured to generate the bulk voltage to provide peaking in frequency.

A transconductance of the transistor may be equal to $$g_m = \frac{\partial I_{ds}}{\partial V_{gs}} = \frac{2I}{V_{DSAT}}\left[1 + \frac{\gamma}{2} \cdot \frac{sR_zC_z}{(1+sR_zC_z)} \cdot \sqrt{\frac{|1+sR_zC_z|}{|2\phi_F + sR_zC_z(2\phi_F - V_{gs})|}}\right],$$

where $V_{DSAT}$ may be a saturation voltage of the transistor, I may be a DC current through the transistor, $\gamma$ may be a technology-dependent constant, Rz may be a resistance of the bulk resistor, Cz may be a capacitance of the bulk capacitor, s may be a Laplace transform variable, $\phi_F$ may be a technology-dependent constant, and $V_{gs}$ may be a gate-source voltage of the transistor.

The amplifier may further include a load resistor coupled to the second node, and a gain of the amplifier may be equal to $$\frac{V_{out}}{V_{in}} = \frac{2I}{V_{DSAT}}\left[1 + \frac{\gamma}{2} \cdot \frac{sR_zC_z}{(1+sR_zC_z)} \cdot \sqrt{\frac{|1+sR_zC_z|}{|2\phi_F + sR_zC_z(2\phi_F - V_{gs})|}}\right] \cdot R_{load},$$

where $V_{DSAT}$ may be a saturation voltage of the transistor, I may be a DC current through the transistor, $\gamma$ may be a technology-dependent constant, Rz may be a resistance of the bulk resistor, Cz may be a capacitance of the bulk capacitor, s may be a Laplace transform variable, $\phi_F$ may be a technology-dependent constant, $V_{gs}$ may be a gate-source voltage of the transistor, and $R_{load}$ may be a resistance of the load resistor.

According to an embodiment of the present invention, an amplifier includes: an input terminal coupled to a first node; an output terminal coupled to a second node; and a transistor coupled between a first power source and a second power source, the transistor including: a gate electrode coupled to the first node; a drain electrode coupled to the second node; a source electrode coupled to a third node; and a bulk electrode coupled to a fourth node and configured to receive a bulk voltage to change a threshold voltage of the transistor.

The amplifier may further include: a bulk capacitor coupled between the first node and the fourth node.

The amplifier may further include: a bulk resistor coupled between the third node and the fourth node.

The transistor may include an NMOS transistor, and the third node may be coupled to the second power source.

The transistor may further include a PMOS transistor, and the third node may be coupled to the first power source.

The bulk capacitor and the bulk resistor may be configured to generate the bulk voltage to provide peaking in frequency.

A transconductance of the transistor may be equal to $$g_m = \frac{\partial I_{ds}}{\partial V_{gs}} = \frac{2I}{V_{DSAT}}\left[1 + \frac{\gamma}{2} \cdot \frac{sR_zC_z}{(1+sR_zC_z)} \cdot \sqrt{\frac{|1+sR_zC_z|}{|2\phi_F + sR_zC_z(2\phi_F - V_{gs})|}}\right],$$

where $V_{DSAT}$ may be a saturation voltage of the transistor, I may be a DC current through the transistor, $\gamma$ may be a technology-dependent constant, Rz may be a resistance of the bulk resistor, Cz may be a capacitance of the bulk capacitor, s may be a Laplace transform variable, $\phi_F$ may be a technology-dependent constant, and $V_{gs}$ may be a gate-source voltage of the transistor.

The amplifier may further include a load resistor coupled to the second node, and a gain of the amplifier may be equal to $$\frac{V_{out}}{V_{in}} = \frac{2I}{V_{DSAT}}\left[1 + \frac{\gamma}{2} \cdot \frac{sR_zC_z}{(1+sR_zC_z)} \cdot \sqrt{\frac{|1+sR_zC_z|}{|2\phi_F + sR_zC_z(2\phi_F - V_{gs})|}}\right] \cdot R_{load},$$

where $V_{DSAT}$ may be a saturation voltage of the transistor, I may be a DC current through the transistor, $\gamma$ may be a technology-dependent constant, Rz may be a resistance of the bulk resistor, Cz may be a capacitance of the bulk capacitor, s may be a Laplace transform variable, $\phi_F$ may be a technology-dependent constant, $V_{gs}$ may be a gate-source voltage of the transistor, and $R_{load}$ may be a resistance of the load resistor.

According to an embodiment of the present invention, a method of increasing a 3 dB loss frequency of a common source amplifier including a transistor coupled between a first power source and a second power source, a bulk capacitor coupled between a gate electrode and a bulk electrode of the transistor, a bulk resistor coupled between a source electrode and the bulk electrode of the transistor, and a load resistor coupled to a drain electrode of the transistor, includes: generating a bulk voltage at the bulk electrode of the transistor, the bulk voltage being equal to $$V_B(s) = \frac{sR_zC_z}{1+sR_zC_z}V_{in}(s),$$

where s is a Laplace transform variable, Rz is a resistance of the bulk resistor, Cz is a capacitance of the bulk capacitor, and Vin is an input voltage applied to the gate electrode of the transistor.

The method may further include: changing a threshold voltage of the transistor according to the bulk voltage to provide frequency peaking, and the threshold voltage may be equal to $$V_T = V_{TO} + \gamma\left(\sqrt{\left|\frac{-sR_zC_z}{1+sR_zC_z}V_{in} + 2\phi_F\right|} - \sqrt{|2\phi_F|}\right),$$

where $V_{TO}$ may be a nominal value of the threshold voltage when the bulk electrode of the transistor is connected to its source electrode, and $\gamma$ and $\phi_F$ may be technology-dependent constants.

A transconductance of the transistor may be equal to $$g_m = \frac{\partial I_{ds}}{\partial V_{gs}} = \frac{2I}{V_{DSAT}}\left[1 + \frac{\gamma}{2} \cdot \frac{sR_zC_z}{(1+sR_zC_z)} \cdot \sqrt{\frac{|1+sR_zC_z|}{|2\phi_F + sR_zC_z(2\phi_F - V_{gs})|}}\right],$$

where $V_{DSAT}$ may be a saturation voltage of the transistor, I may be a DC current through the transistor, $\gamma$ and $\phi_F$ may be technology-dependent constants, and $V_{gs}$ may be a gate-source voltage of the transistor.

A gain of the amplifier may be equal to $$\frac{V_{out}}{V_{in}} = \frac{2I}{V_{DSAT}}\left[1 + \frac{\gamma}{2} \cdot \frac{sR_zC_z}{(1+sR_zC_z)} \cdot \sqrt{\frac{|1+sR_zC_z|}{|2\phi_F + sR_zC_z(2\phi_F - V_{gs})|}}\right] \cdot R_{load},$$

where $V_{DSAT}$ may be a saturation voltage of the transistor, I may be a DC current through the transistor, $\gamma$ and $\phi_F$ may be technology-dependent constants, $V_{gs}$ may be a gate-source voltage of the transistor, and $R_{load}$ may be a resistance of the load resistor.

BRIEF DESCRIPTION OF THE DRAWINGS

The above and other aspects and features of the present invention will become apparent to those skilled in the art from the following detailed description of the example embodiments with reference to the accompanying drawings.

DETAILED DESCRIPTION

Figure 1:
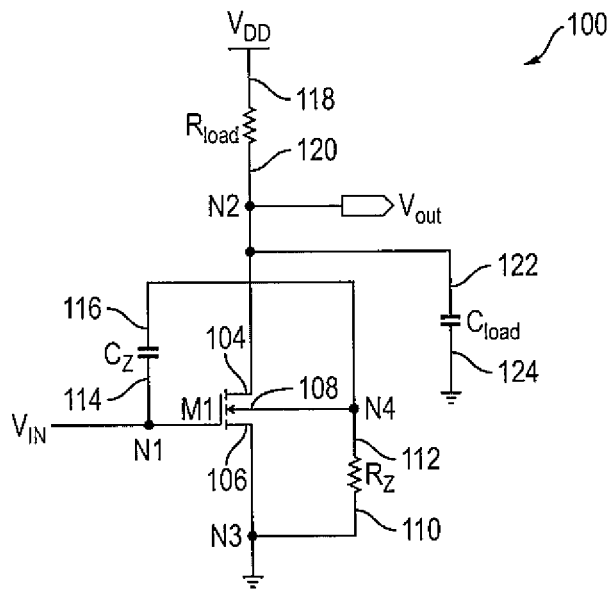
FIG. 1 is a circuit diagram of a common source amplifier, according to some embodiments of the present invention.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

According to some embodiments of the present invention, a peaking amplifier is provided in which frequency peaking is provided such that the 3 dB loss frequency is increased, but with negligible or no loss in DC gain. In other peaking amplifiers (e.g., source-degenerated) the DC gain is typically reduced in order to provide the peaking. According to some embodiments of the present invention, the peaking is provided by generating zeros and poles at a bulk electrode of the common-source transistor, thereby changing the threshold voltage of the common-source transistor.

According to some embodiments of the present invention, the peaking amplifier may be utilized in continuous time linear equalizers in high-speed I/O applications where data is transferred across a channel with frequency selective attenuation. The linear equalizer may compensate for the high-frequency loss of the channel, and may flatten the channel response. For example, the peaking amplifier may be utilized in electronic devices that include peripheral component interconnect express (PCI-e) applications, Universal Serial Bus (USB) applications, high-definition multimedia interface (HDMI) applications, etc. However, the present invention is not limited thereto.

FIG. 1 is a circuit diagram of a common source amplifier, according to some embodiments of the present invention.

Referring to FIG. 1, a common source amplifier (e.g., a peaking amplifier) 100 includes a transistor M1 (e.g., an NMOS transistor) coupled between a first power source (e.g., a high power source) Vdd and a second power source (e.g., a low power source or ground) Vss. The transistor M1 includes a gate electrode 102 coupled to a first node N1, a drain electrode 104 coupled to a second node N2, a source electrode 106 coupled to a third node N3, and a bulk electrode 108 coupled to a fourth node N4.

An input terminal Vin is coupled to the first node N1, an output terminal Vout is coupled to the second node N2, and the second power source Vss is coupled to the third node N3. That is, the input terminal Vin is coupled to the gate electrode 102 of the transistor M1, the output terminal Vout is coupled to the drain electrode 104 of the transistor M1, and the second power source Vss is coupled to the source electrode 106 of the transistor M1.

A bulk resistor Rz is coupled between the third node N3 and the fourth node N4. A first electrode 110 of the bulk resistor Rz is coupled to the third node N3, and a second electrode 112 of the bulk resistor Rz is coupled to the fourth node N4. That is, the bulk resistor Rz is coupled between the source and bulk electrodes 106 and 108 of the transistor M1.

A bulk capacitor Cz is coupled between the first node N1 and the fourth node N4. A first electrode 114 of the bulk capacitor Cz is coupled to the first node N1, and a second electrode 116 of the bulk capacitor Cz is coupled to the fourth node N4. That is, the bulk capacitor Cz is coupled between the gate and bulk electrodes 102 and 108 of the transistor M1.

As will be described in more detail below, the bulk resistor Rz and the bulk capacitor Cz are configured to generate zeros and poles at the bulk electrode 108 of the transistor M1. Accordingly, the common source amplifier according to some embodiments of the present invention will have zeros and poles in its transfer function to produce peaking in frequency.

A load resistor $R_{load}$ is coupled between the first power source Vdd and the second node N2. A first electrode 118 of the load resistor $R_{load}$ is coupled to the first power source Vdd, and a second electrode 120 of the load resistor $R_{load}$ is coupled to the second node N2. That is, the second electrode 120 of the load resistor $R_{load}$ is coupled to the drain electrode 104 of the transistor M1 and the output terminal Vout at the second node N2.

A load capacitor $C_{load}$ is coupled between the second node N2 and the second power source Vss. A first electrode 122 of the load capacitor $C_{load}$ is coupled to the second node N2, and a second electrode 124 of the load capacitor $C_{load}$ is coupled to the second power source Vss. That is, the first electrode 122 of the load capacitor $C_{load}$ is coupled to the second electrode 120 of the load resistor $R_{load}$, the output terminal Vout, and the drain electrode 104 of the transistor M1 at the second node N2.

Figure 2:
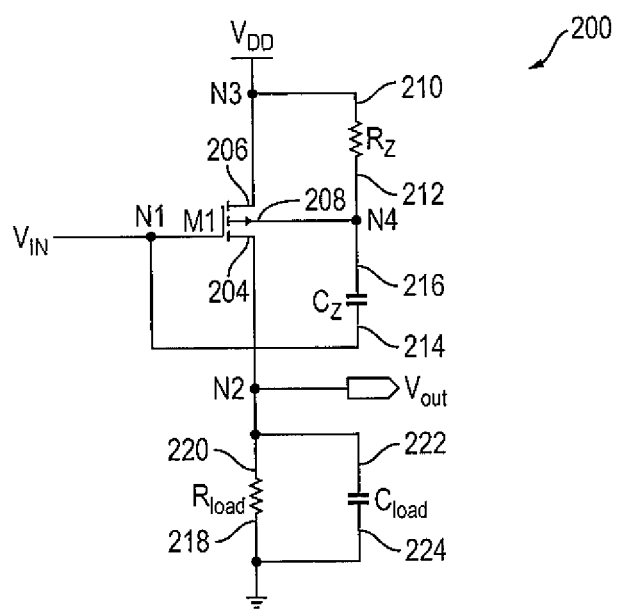
FIG. 2 is a circuit diagram of a common source amplifier, according to some embodiments of the present invention.

FIG. 2 is a circuit diagram of a common source amplifier, according to some embodiments of the present invention.

Referring to FIG. 2, a common source amplifier 200 includes a transistor M1 (e.g., a PMOS transistor) coupled between a first power source (e.g., a high power source) Vdd and a second power source (e.g., a low power source or ground) Vss. The transistor M1 includes a gate electrode 202 coupled to a first node N1, a drain electrode 204 coupled to a second node N2, a source electrode 206 coupled to a third node N3, and a bulk electrode 208 coupled to a fourth node N4.

An input terminal Vin is coupled to the first node N1, an output terminal Vout is coupled to the second node N2, and the first power source Vdd is coupled to the third node N3. That is, the input terminal Vin is coupled to the gate electrode 202 of the transistor M1, the output terminal Vout is coupled to the drain electrode 204 of the transistor M1, and the first power source Vdd is coupled to the source electrode 206 of the transistor M1.

A bulk resistor Rz is coupled between the third node N3 and the fourth node N4. A first electrode 210 of the bulk resistor Rz is coupled to the third node N3, and a second electrode 212 of the bulk resistor Rz is coupled to the fourth node N4. That is, the bulk resistor Rz is coupled between the source and bulk electrodes 206 and 208 of the transistor M1.

A bulk capacitor Cz is coupled between the first node N1 and the fourth node N4. A first electrode 214 of the bulk capacitor Cz is coupled to the first node N1, and a second electrode 216 of the bulk capacitor Cz is coupled to the fourth node N4. That is, the bulk capacitor Cz is coupled between the gate and bulk electrodes 202 and 208 of the transistor M1.

As will be described in more detail below, the bulk resistor Rz and the bulk capacitor Cz are configured to generate zeros and poles at the bulk electrode 208 of the transistor M1. Accordingly, the common source amplifier according to some embodiments of the present invention will have zeros and poles in its transfer function to produce peaking in frequency.

A load resistor $R_{load}$ is coupled between the second power source Vss and the second node N2. A first electrode 218 of the load resistor $R_{load}$ is coupled to the second power source Vss, and a second electrode 220 of the load resistor $R_{load}$ is coupled to the second node N2. That is, the second electrode 220 of the load resistor $R_{load}$ is coupled to the drain electrode 204 of the transistor M1 and the output terminal Vout at the second node N2.

A load capacitor $C_{load}$ is coupled between the second node N2 and the second power source Vss. A first electrode 222 of the load capacitor $C_{load}$ is coupled to the second node N2, and a second electrode 224 of the load capacitor $C_{load}$ is coupled to the second power source Vss. That is, the first electrode 222 of the load capacitor $C_{load}$ is coupled to the second electrode 220 of the load resistor $R_{load}$, the output terminal Vout, and the drain electrode 204 of the transistor M1 at the second node N2.

Referring to FIGS. 1 and 2, according to some embodiments of the present invention, the bulk resistor Rz and the bulk capacitor Cz are configured to generate zeros and poles at the bulk electrode of the transistor M1. The bulk resistor Rz and the bulk capacitor Cz generate a bulk voltage $V_B(s)$ at the fourth node N4 according to the input voltage $V_{in}(s)$, where s is a Laplace transform variable. The bulk voltage $V_B(s)$ at the fourth node N4 may be determined by equation $$V_B(s) = \frac{sR_zC_z}{1+sR_zC_z}V_{in}(s) \tag{1}$$

The threshold voltage $V_T$ of the transistor M1 is proportional to the bulk voltage $V_B(s)$, and thus, may be changed according to the bulk voltage $V_B(s)$. The threshold voltage $V_T$ may be determined by equation (2):

$$V_T = V_{TO} + \gamma(\sqrt{|V_{SB}+2\phi_F|} - \sqrt{|2\phi_F|}) \tag{2}$$

wherein, $V_{TO}$ represents a nominal value of the threshold voltage when the bulk electrode of the transistor M1 is connected to its source electrode, γ represents a technology-dependent constant, $V_{SB}$ represents the voltage difference between the source and bulk electrodes (e.g., $V_{SB}=V_S-V_B$) of the transistor M1, and $\phi_F$ represents a technology-dependent constant.

By substituting the bulk voltage $V_B(s)$ in equation (1) for the voltage $V_{SB}$ in equation (2) (e.g., $V_{SB}=-V_B$, when the source electrode is connected to a zero potential), equation (3) may be determined as $$V_T = V_{TO} + \gamma\left(\sqrt{\left|\frac{-sR_zC_z}{1+sR_zC_z}V_{in}+2\phi_F\right|} - \sqrt{|2\phi_F|}\right) \tag{3}$$

The drain-source current $I_{ds}$ of the transistor M1 may be determined by equation (4):

$$I_{ds} = k(V_{gs}-V_T)^2 \tag{4}$$

wherein, $V_{gs}$ represents the gate source voltage of the transistor M1.

By substituting the threshold voltage $V_T$ in equation (3) for the threshold voltage $V_T$ in equation (4), the transconductance $g_m$ of the transistor M1 may be determined by equation (5):

$$g_m = \tag{5}$$
$$\frac{\partial I_{ds}}{\partial V_{gs}} = \frac{2I}{V_{DSAT}}\left[1+\frac{\gamma}{2}\cdot\frac{sR_zC_z}{(1+sR_zC_z)}\cdot\sqrt{\frac{|1+sR_zC_z|}{|2\phi_F+sR_zC_z(2\phi_F-V_{gs})|}}\right]$$

where $V_{DSAT}$ represents the saturation voltage of the transistor M1, and I represents the DC current (or the bias current) through the transistor M1.

The gain of the common source amplifier may be determined by equation (6):

$$\frac{V_{out}}{V_{in}} = \tag{6}$$
$$\frac{2I}{V_{DSAT}}\left[1+\frac{\gamma}{2}\cdot\frac{sR_zC_z}{(1+sR_zC_z)}\cdot\sqrt{\frac{|1+sR_zC_z|}{|2\phi_F+sR_zC_z(2\phi_F-V_{gs})|}}\right]\cdot R_{load}$$

Accordingly, the common source amplifier according to some embodiments of the present invention may have a higher bandwidth than that of other common source amplifiers by providing frequency peaking to increase the 3 dB loss frequency, but with negligible loss or no loss in DC gain.

Figure 3:
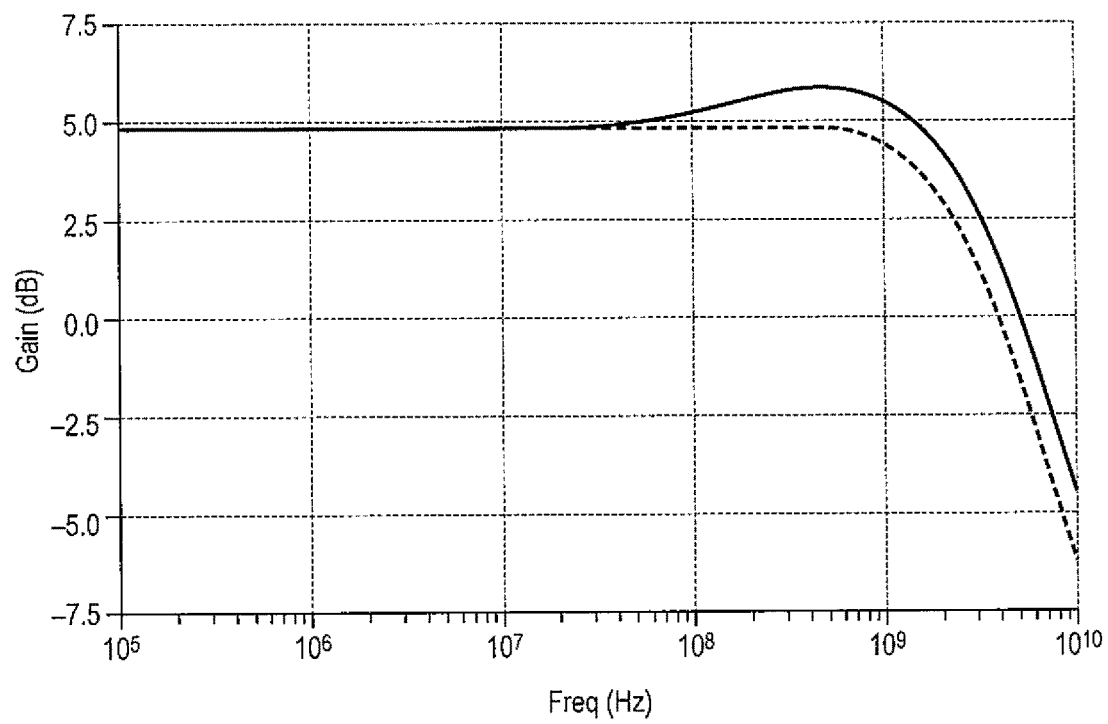
FIG. 3 is a graph illustrating the frequency response of a common source amplifier according to some embodiments of the present invention compared with that of another common source amplifier.

FIG. 3 is a graph illustrating frequency response of a common source amplifier according to some embodiments of the present invention compared with that of another common source amplifier.

Referring to FIG. 3, the common source amplifier shown in FIG. 1, according to some embodiments of the present invention, was simulated and compared with a simulation of another common source amplifier. The other common source amplifier has substantially the same configuration as that of the common source amplifier shown in FIG. 1, but the bulk resistor Rz and the bulk capacitor Cz were omitted. The solid line represents the frequency response of the common source amplifier shown in FIG. 1, according to some embodiments of the present invention, and the dotted line represents the other common source amplifier with the bulk resistor Rz and the bulk capacitor Cz omitted.

Each of the common source amplifier of FIG. 1 and the other common source amplifier was simulated using the following parameters: 180 nm process, input transistor (e.g., the transistor M1 shown in FIG. 1) implemented as an NMOS transistor having a size of 5 μm/180 nm, DC current $I_{dc}$ of 200 μA, load resistor $R_{load}$ of 600Ω, load capacitor $C_{load}$ of −75 fF, first power source Vdd set at 1.8V, and second power source Vss set as ground. Further, for the common source amplifier of FIG. 1, the bulk resistor Rz was set at 6 kΩ and the bulk capacitor Cz was set at 100 fF. The other common source amplifier did not include a bulk resistor Rz nor a bulk capacitor Cz.

According to FIG. 3, the 3 dB loss frequency of the common source amplifier according to some embodiments of the present invention has a 3 dB loss frequency of about 3.9 GHz, whereas the other common source amplifier has a 3 dB loss frequency of about 2.9 GHz. That is, the 3 dB loss frequency has increased by about 33% in the common source amplifier of FIG. 1 when compared to that of the other common source amplifier.

Accordingly, in some embodiments of the present invention, frequency peaking is provided such that the 3 dB loss frequency is increased, but with negligible or no loss in DC gain when compared to that of other peaking amplifiers (e.g., source-degenerated).

According to some embodiments of the present invention, the peaking is generated by changing the bulk voltage, and thereby, changing the threshold voltage of the common-source transistor. A bulk capacitor is coupled between a bulk electrode of the transistor and an input node, and a bulk resistor is coupled between the bulk electrode and a power supply. The bulk capacitor and the bulk resistor generate zeros and poles at the bulk electrode of the transistor according to the input, thereby altering the threshold voltage of the transistor and increasing the 3 dB loss frequency.

As described above, the peaking amplifier, according to one or more embodiments of the present invention, may be utilized in electronic devices that include peripheral component interconnect express (PCI-e) applications, Universal Serial Bus (USB) applications, high-definition multimedia interface (HDMI) applications, etc. Some examples of these electronic devices may include, for example, display devices, smartphones, digital cameras, laptop computers, personal computers, navigation units, televisions, etc. The display device may include a plurality of pixels coupled to a plurality of gate lines and a plurality of data lines. However, examples of the electronic devices are not limited thereto, and the electronic device may include any suitable electronic device that may utilize a peaking amplifier in high-speed I/O applications where data is transferred across a channel.

Although the present invention has been described with reference to the example embodiments, those skilled in the art will recognize that various changes and modifications to the described embodiments may be performed, all without departing from the spirit and scope of the present invention. Furthermore, those skilled in the various arts will recognize that the present invention described herein will suggest solutions to other tasks and adaptations for other applications. It is the applicant's intention to cover by the claims herein, all such uses of the present invention, and those changes and modifications which could be made to the example embodiments of the present invention herein chosen for the purpose of disclosure, all without departing from the spirit and scope of the present invention. Thus, the example embodiments of the present invention should be considered in all respects as illustrative and not restrictive, with the spirit and scope of the present invention being indicated by the appended claims, and their equivalents.

What is claimed is:

1. An electronic device comprising:
   a display device comprising a plurality of pixels coupled to a plurality of gate lines and a plurality of data lines; and
   an amplifier comprising:
   an input terminal coupled to a first node;
   an output terminal coupled to a second node; and
   a transistor coupled between a first power source and a second power source, the transistor comprising:
   a gate electrode coupled to the first node;
   a drain electrode coupled to the second node;
   a source electrode coupled to a third node; and
   a bulk electrode coupled to a fourth node and configured to receive a bulk voltage to change a threshold voltage of the transistor.

2. The electronic device of claim 1, wherein the amplifier further comprises:
   a bulk capacitor coupled between the first node and the fourth node.

3. The electronic device of claim 2, wherein the amplifier further comprises:
   a bulk resistor coupled between the third node and the fourth node.

4. The electronic device of claim 3, wherein:
   the transistor comprises an NMOS transistor, and
   the third node is coupled to the second power source.

5. The electronic device of claim 3, wherein:
   the transistor comprises a PMOS transistor, and
   the third node is coupled to the first power source.

6. The electronic device of claim 3,
   wherein the bulk capacitor and the bulk resistor are configured to generate the bulk voltage to provide peaking in frequency.

7. The electronic device claim 3, wherein a transconductance of the transistor is equal to $$g_m = \frac{\partial I_{ds}}{\partial V_{gs}} = \frac{2I}{V_{DSAT}}\left[1 + \frac{\gamma}{2} \cdot \frac{sR_zC_z}{(1+sR_zC_z)} \cdot \sqrt{\frac{|1+sR_zC_z|}{|2\phi_F + sR_zC_z(2\phi_F - V_{gs})|}}\right],$$

where $V_{DSAT}$ is a saturation voltage of the transistor, I is a DC current through the transistor, γ is a technology-dependent constant, Rz is a resistance of the bulk resistor, Cz is a capacitance of the bulk capacitor, s is a Laplace transform variable, $\phi_F$ is a technology-dependent constant, and $V_{gs}$ is a gate-source voltage of the transistor.

8. The electronic device of claim 3, wherein the amplifier further comprises a load resistor coupled to the second node, and
wherein a gain of the amplifier is equal to $$\frac{V_{out}}{V_{in}} = \frac{2I}{V_{DSAT}} \left[ 1 + \frac{\gamma}{2} \cdot \frac{sR_zC_z}{(1+sR_zC_z)} \cdot \sqrt{\frac{|1+sR_zC_z|}{|2\phi_F + sR_zC_z(2\phi_F - V_{gs})|}} \right] \cdot R_{load},$$

where $V_{DSAT}$ is a saturation voltage of the transistor, I is a DC current through the transistor, $\gamma$ is a technology-dependent constant, Rz is a resistance of the bulk resistor, Cz is a capacitance of the bulk capacitor, s is a Laplace transform variable, $\phi_F$ is a technology-dependent constant, $V_{gs}$ is a gate-source voltage of the transistor, and $R_{load}$ is a resistance of the load resistor.

9. An amplifier comprising:
an input terminal coupled to a first node;
an output terminal coupled to a second node;
a transistor coupled between a first power source and a second power source, the transistor comprising:
a gate electrode coupled to the first node;
a drain electrode coupled to the second node;
a source electrode coupled to a third node; and
a bulk electrode coupled to a fourth node and configured to receive a bulk voltage to change a threshold voltage of the transistor; and
a bulk resistor coupled between the third node and the fourth node, the bulk resistor being configured to receive a current flowing between the third node and the fourth node.

10. The amplifier of claim 9 further comprising:
a bulk capacitor coupled between the first node and the fourth node.

11. The amplifier of claim 10, wherein:
the transistor comprises an NMOS transistor, and
the third node is coupled to the second power source.

12. The amplifier of claim 10, wherein:
the transistor comprises a PMOS transistor, and
the third node is coupled to the first power source.

13. The amplifier of claim 10,
wherein the bulk capacitor and the bulk resistor are configured to generate the bulk voltage to provide peaking in frequency.

14. The amplifier of claim 10, wherein a transconductance of the transistor is equal to $$g_m = \frac{\partial I_{ds}}{\partial V_{gs}} = \frac{2I}{V_{DSAT}} \left[ 1 + \frac{\gamma}{2} \cdot \frac{sR_zC_z}{(1+sR_zC_z)} \cdot \sqrt{\frac{|1+sR_zC_z|}{|2\phi_F + sR_zC_z(2\phi_F - V_{gs})|}} \right],$$

where $V_{DSAT}$ is a saturation voltage of the transistor, I is a DC current through the transistor, $\gamma$ is a technology-dependent constant, Rz is a resistance of the bulk resistor, Cz is a capacitance of the bulk capacitor, s is a Laplace transform variable, $\phi_F$ is a technology-dependent constant, and $V_{gs}$ is a gate-source voltage of the transistor.

15. The amplifier of claim 10, wherein the amplifier further comprises a load resistor coupled to the second node, and
wherein a gain of the amplifier is equal to $$\frac{V_{out}}{V_{in}} = \frac{2I}{V_{DSAT}} \left[ 1 + \frac{\gamma}{2} \cdot \frac{sR_zC_z}{(1+sR_zC_z)} \cdot \sqrt{\frac{|1+sR_zC_z|}{|2\phi_F + sR_zC_z(2\phi_F - V_{gs})|}} \right] \cdot R_{load},$$

where $V_{DSAT}$ is a saturation voltage of the transistor, I is a DC current through the transistor, $\gamma$ is a technology-dependent constant, Rz is a resistance of the bulk resistor, Cz is a capacitance of the bulk capacitor, s is a Laplace transform variable, $\phi_F$ is a technology-dependent constant, $V_{gs}$ is a gate-source voltage of the transistor, and $R_{load}$ is a resistance of the load resistor.

16. A method of increasing a 3 dB loss frequency of a common source amplifier including a transistor coupled between a first power source and a second power source, a bulk capacitor coupled between a gate electrode and a bulk electrode of the transistor, a bulk resistor coupled between a source electrode and the bulk electrode of the transistor, and a load resistor coupled to a drain electrode of the transistor, the method comprising:
generating a bulk voltage at the bulk electrode of the transistor,
wherein the bulk voltage is equal to $$V_B(s) = \frac{sR_zC_z}{1+sR_zC_z} V_{in}(s),$$

where s is a Laplace transform variable, Rz is a resistance of the bulk resistor, Cz is a capacitance of the bulk capacitor, and Vin is an input voltage applied to the gate electrode of the transistor.

17. The method of claim 16 further comprising:
changing a threshold voltage of the transistor according to the bulk voltage to provide frequency peaking,
wherein the threshold voltage is equal to $$V_T = V_{TO} + \gamma \left( \sqrt{\left| \frac{-sR_zC_z}{1+sR_zC_z} V_{in} + 2\phi_F \right|} - \sqrt{|2\phi_F|} \right),$$

where $V_{TO}$ is a nominal value of the threshold voltage when the bulk electrode of the transistor is connected to its source electrode, and $\gamma$ and $\phi_F$ are technology-dependent constants.

18. The method of claim 16, wherein a transconductance of the transistor is equal to $$g_m = \frac{\partial I_{ds}}{\partial V_{gs}} = \frac{2I}{V_{DSAT}} \left[ 1 + \frac{\gamma}{2} \cdot \frac{sR_zC_z}{(1+sR_zC_z)} \cdot \sqrt{\frac{|1+sR_zC_z|}{|2\phi_F + sR_zC_z(2\phi_F - V_{gs})|}} \right],$$

where $V_{DSAT}$ is a saturation voltage of the transistor, I is a DC current through the transistor, $\gamma$ and $\phi_F$ are technology-dependent constants, and $V_{gs}$ is a gate-source voltage of the transistor.

19. The method of claim 16, wherein a gain of the amplifier is equal to $$\frac{V_{out}}{V_{in}} = \frac{2I}{V_{DSAT}} \left[ 1 + \frac{\gamma}{2} \cdot \frac{sR_zC_z}{(1+sR_zC_z)} \cdot \sqrt{\frac{|1+sR_zC_z|}{|2\phi_F + sR_zC_z(2\phi_F - V_{gs})|}} \right] \cdot R_{load},$$

where $V_{DSAT}$ is a saturation voltage of the transistor, I is a DC current through the transistor, $\gamma$ and $\phi_F$ are technology-dependent constants, $V_{gs}$ is a gate-source voltage of the transistor, and $R_{load}$ is a resistance of the load resistor.

* * * * *